(12) United States Patent
Chang et al.

(10) Patent No.: US 12,108,517 B2
(45) Date of Patent: Oct. 1, 2024

(54) SENSOR LENS ASSEMBLY HAVING NON-SOLDERING CONFIGURATION

(71) Applicant: KINGPAK TECHNOLOGY INC., Hsin-Chu County (TW)

(72) Inventors: Chia-Shuai Chang, Hsin-Chu County (TW); Chien-Chen Lee, Hsin-Chu County (TW); Li-Chun Hung, Hsin-Chu County (TW); Ya-Han Chang, Hsin-Chu County (TW)

(73) Assignee: TONG HSING ELECTRONIC INDUSTRIES, LTD., Taipei (TW)

( * ) Notice: Subject to any disclaimer, the term of this patent is extended or adjusted under 35 U.S.C. 154(b) by 501 days.

(21) Appl. No.: 17/580,577

(22) Filed: Jan. 20, 2022

(65) Prior Publication Data

US 2022/0394845 A1 Dec. 8, 2022

Related U.S. Application Data

(60) Provisional application No. 63/196,685, filed on Jun. 4, 2021.

(30) Foreign Application Priority Data

Nov. 16, 2021 (TW) .................................. 110142470

(51) Int. Cl.
*H05K 1/02* (2006.01)
*H01L 23/00* (2006.01)
*H05K 1/11* (2006.01)
*H05K 1/18* (2006.01)

(52) U.S. Cl.
CPC ........... *H05K 1/0274* (2013.01); *H01L 24/32* (2013.01); *H01L 24/48* (2013.01); *H01L 24/73* (2013.01); *H05K 1/11* (2013.01); *H05K 1/181* (2013.01); *H01L 2224/32225* (2013.01); *H01L 2224/48228* (2013.01); *H01L 2224/73215* (2013.01); *H05K 2201/10121* (2013.01); *H05K 2201/10151* (2013.01)

(58) Field of Classification Search
CPC .......... H05K 1/02; H05K 1/0274; H05K 1/11; H05K 1/181; H01L 24/32; H01L 24/48
USPC ........................................................ 361/760
See application file for complete search history.

(56) References Cited

FOREIGN PATENT DOCUMENTS

| CN | 2765329 Y | 3/2006 |
|---|---|---|
| CN | 107395938 A | 11/2017 |

*Primary Examiner* — Tremesha W Burns
(74) *Attorney, Agent, or Firm* — Li & Cai Intellectual Property Office

(57) ABSTRACT

A sensor lens assembly having a non-soldering configuration is provided. The sensor lens assembly includes a circuit board, an optical module fixed to the circuit board, a sensor chip and an extending wall both assembled to the circuit board, a plurality of wires electrically coupling the sensor chip and the circuit board, a supporting adhesive layer, and a light-permeable sheet. The extending wall surrounds the sensor chip and has an extending top surface that is substantially flush with a top surface of the sensor chip. The supporting adhesive layer is in a ringed shape and is disposed on the extending top surface of the extending wall and the top surface of the sensor chip. The light-permeable sheet is disposed on the supporting adhesive layer, so that the light-permeable sheet, the supporting adhesive layer, and the top surface of the sensor chip jointly define an enclosed space.

16 Claims, 14 Drawing Sheets

SENSOR LENS ASSEMBLY HAVING NON-SOLDERING CONFIGURATION

CROSS-REFERENCE TO RELATED PATENT APPLICATION

This application claims the benefit of priority to Taiwan Patent Application No. 110142470, filed on Nov. 16, 2021. The entire content of the above identified application is incorporated herein by reference.

This application claims priority to the U.S. Provisional Patent Application Ser. No. 63/196,685 filed on Jun. 4, 2021, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a sensor lens assembly, and more particularly to a sensor lens assembly having a non-soldering configuration.

BACKGROUND OF THE DISCLOSURE

A conventional sensor lens assembly is manufactured by fixing a sensor package structure onto a circuit board during a soldering process and then assembling an optical module to the circuit board. However, a structural configuration of the conventional sensor lens assembly is limited by the sensor package structure, so that the structural configuration of the conventional sensor lens assembly is difficult to be improved. For example, since the sensor package structure of the conventional sensor lens assembly needs to undergo the soldering process for being fixed onto the circuit board, the connection between any two components of the sensor package structure must be capable of resisting high temperature.

SUMMARY OF THE DISCLOSURE

In response to the above-referenced technical inadequacy, the present disclosure provides a sensor lens assembly having a non-soldering configuration to effectively improve on the issues associated with conventional sensor lens assemblies.

In one aspect, the present disclosure provides a sensor lens assembly having a non-soldering configuration, which includes a circuit board, an optical module, a sensor chip, an extending wall, a plurality of wires, a supporting adhesive layer, and a light-permeable sheet. The circuit board has a first surface and a second surface that is opposite to the first surface. The first surface of the circuit board includes a chip-bonding region and a plurality of bonding pads that are arranged outside of the chip-bonding region. The optical module includes a frame, at least one lens, and a filtering sheet. The frame is fixed on the first surface of the circuit board. The at least one lens is assembled into the frame, and a central axis of the at least one lens passes through the chip-bonding region. The filtering sheet is assembled into the frame and is positioned along the central axis. The frame and the filtering sheet jointly define a distribution space, and the chip-bonding region and the bonding pads are arranged in the distribution space. The sensor chip includes a sensing region arranged on a top surface thereof and a plurality of connection pads that are arranged on the top surface and outside of the sensing region. The sensor chip is disposed on the chip-bonding region, and the sensing region is located at the central axis. The extending wall is disposed on the first surface and surrounds the sensor chip. The extending wall has an extending top surface, and a step difference between the extending top surface and the top surface of the sensor chip is less than or equal to 50 µm. The bonding pads are respectively and electrically coupled to the connection pads through the wires. The supporting adhesive layer is in a ringed shape. The supporting adhesive layer is disposed on the extending top surface of the extending wall and the top surface of the sensor chip, and the supporting adhesive layer is arranged outside of the sensing region. The light-permeable sheet has two opposite surfaces respectively coated with two anti-reflective films thereon that respectively define an inner surface and an outer surface. The inner surface of the light-permeable sheet is disposed on the supporting adhesive layer, so that the light-permeable sheet, the supporting adhesive layer, and the top surface of the sensor chip jointly define an enclosed space, and wherein the sensing region is arranged in the enclosed space.

In another aspect, the present disclosure provides a sensor lens assembly having a non-soldering configuration, which includes a circuit board, a sensor chip, a transparent layer, a plurality of wires, a molding compound, a supporting adhesive layer, a light-permeable sheet, and an optical module. The circuit board has a first surface and a second surface that is opposite to the first surface. The first surface of the circuit board includes a chip-bonding region and a plurality of bonding pads that are arranged outside of the chip-bonding region. The sensor chip includes a sensing region arranged on a top surface thereof and a plurality of connection pads that are arranged on the top surface and outside of the sensing region. The sensor chip is disposed on the chip-bonding region. The transparent layer has a low refractive index and is formed on the top surface of the sensor chip. The sensing region is embedded in the transparent layer. The bonding pads are respectively and electrically coupled to the connection pads through the wires. The molding compound is formed on the first surface. The wires and the sensor chip are embedded in the molding compound, and the transparent layer is exposed from an upper surface of the molding compound. The supporting adhesive layer is in a ringed shape. The supporting adhesive layer is disposed on the upper surface of the molding compound and surrounds the transparent layer. The light-permeable sheet has two opposite surfaces respectively coated with two anti-reflective films thereon that respectively define an inner surface and an outer surface. The inner surface of the light-permeable sheet is disposed on the supporting adhesive layer, so that the light-permeable sheet, the supporting adhesive layer, and the transparent layer jointly define an enclosed space. The optical module corresponds in position to the sensing region.

Therefore, through cooperation of the above components, the sensor lens assembly provided by the present disclosure does not need to go through any soldering process through the non-soldering configuration thereof, such as to allow that the component relationships arranged in the distribution space (e.g., connection between any two of the sensor chip, the extending wall, the wires, the supporting adhesive layer, the light-permeable sheet, and the sealing compound) just need to satisfy a lower level of high-temperature resistance requirement. Accordingly, material cost of the sensor lens assembly can be decreased, and the product yield of the sensor lens assembly can be increased. Specifically, since the sensor lens assembly of the present disclosure does not need to go through a soldering process, the sensor lens assembly does not need to be subjected to relevant testing processes, thereby effectively simplifying the entire production process to improve the production efficiency of the sensor lens assembly.

Moreover, the sensor lens assembly of the present disclosure is provided with the extending wall that is in cooperation with the sensor chip and the supporting adhesive layer (or the sensor chip of the sensor lens assembly can be in cooperation with the molding compound by embedding the sensing region in the transparent layer), so that the sensor chip having a small size can be assembled in the sensor lens assembly, thereby allowing the sensor chip to satisfy the trend of miniaturization in the industry.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
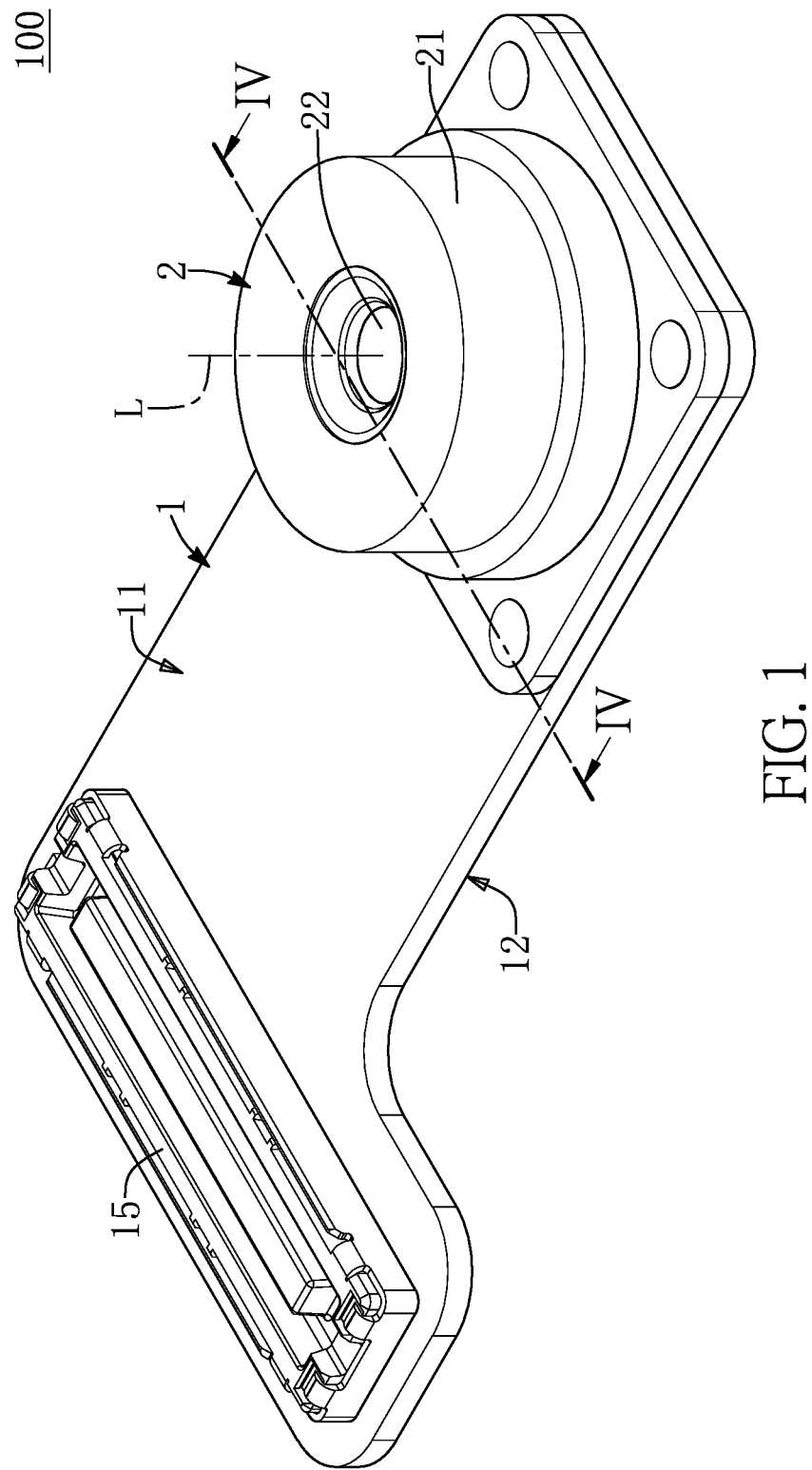
FIG. 1 is a perspective view of a sensor lens assembly having a non-soldering configuration according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
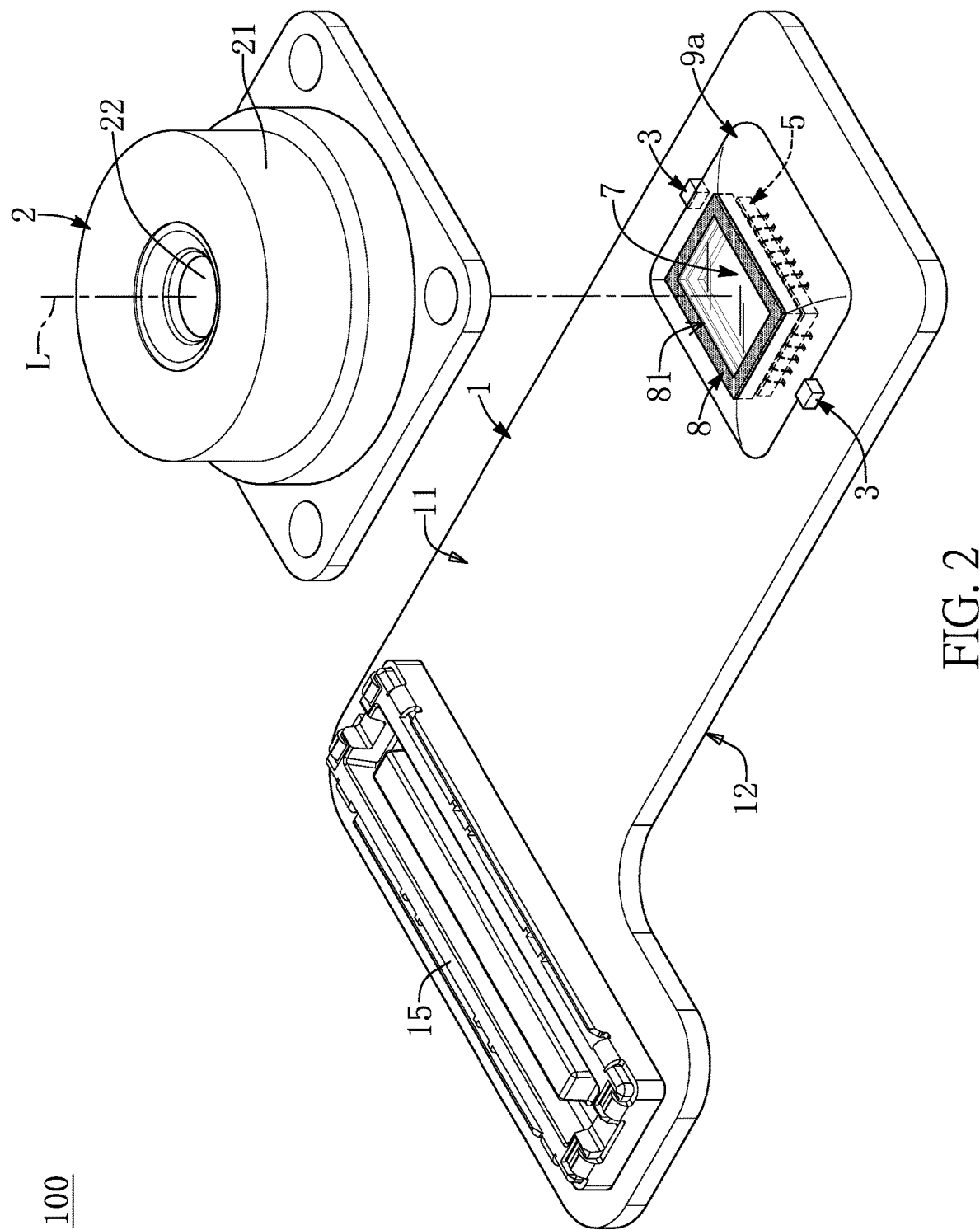
FIG. 2 is an exploded view of FIG. 1.

Referring to FIG. 1 to FIG. 5, a first embodiment of the present disclosure provides a sensor lens assembly 100 having a non-soldering configuration. As shown in FIG. 1 and FIG. 2, the sensor lens assembly 100 of the present embodiment does not have any package structure therein. In other words, any sensor lens assembly, which has a package structure or is formed by implementing a soldering process, is different from the sensor lens assembly 100 of the present embodiment.

Figure 3:
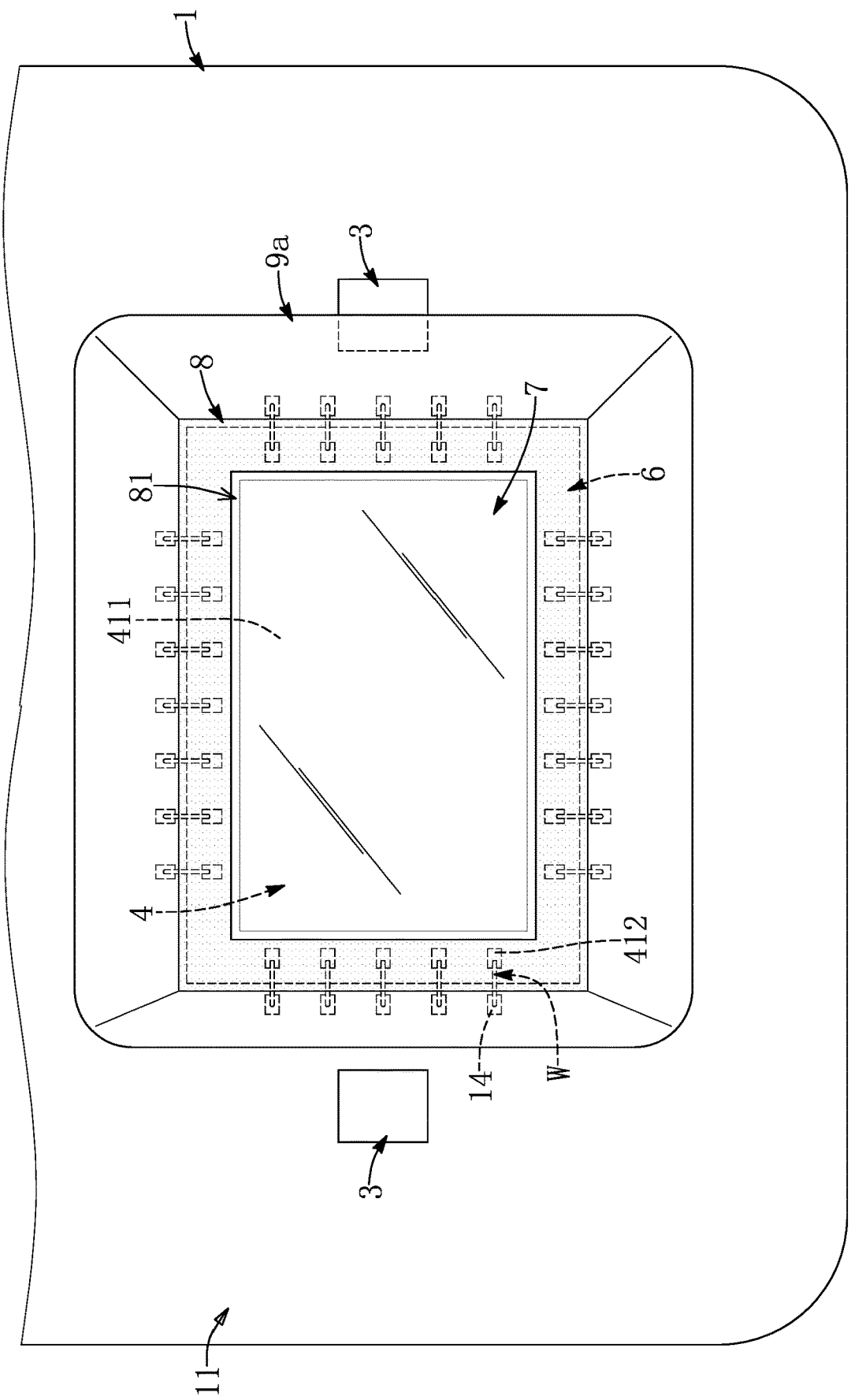
FIG. 3 is a partial top view of FIG. 2 when an optical module is omitted.
Figure 4:
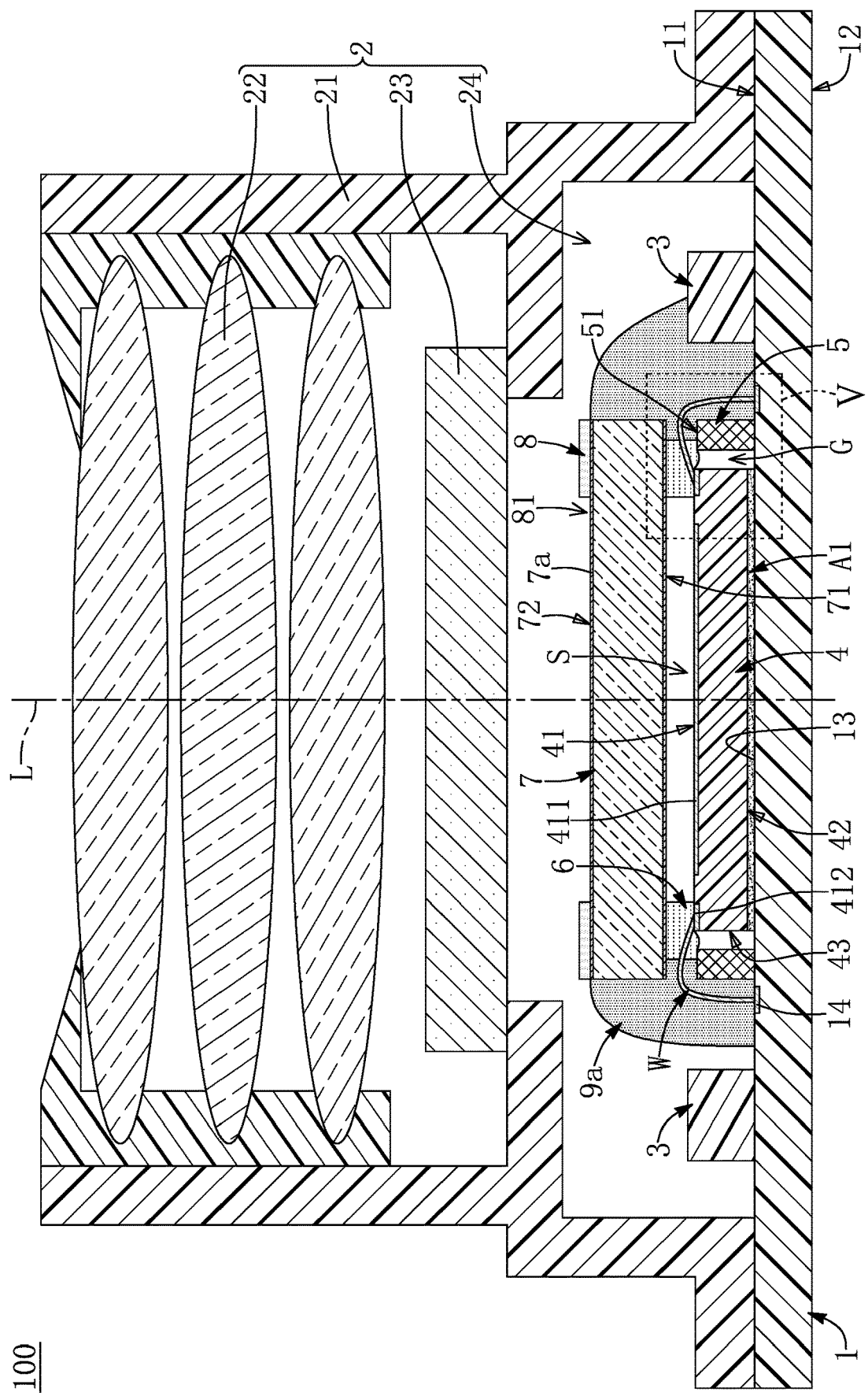
FIG. 4 is a cross-sectional view taken along line IV-IV of FIG. 1.

As shown in FIG. 3 and FIG. 4, the sensor lens assembly 100 includes a circuit board 1, an optical module 2 fixed to the circuit board 1, at least one passive electronic component 3 assembled to the circuit board 1, a sensor chip 4 assembled to the circuit board 1, an extending wall 5 formed on the circuit board 1 and surrounding the sensor chip 4, a plurality of wires W electrically coupling the sensor chip 4 and the circuit board 1, a supporting adhesive layer 6 disposed on the sensor chip 4, a light-permeable sheet 7 disposed on the supporting adhesive layer 6, a shielding layer 8 formed on the light-permeable sheet 7, and a sealing compound 9a.

The sensor lens assembly 100 in the present embodiment is described by including the above components, but the sensor lens assembly 100 can be adjusted or changed according to design requirements. For example, in other embodiments of the present disclosure not shown in the drawings, the sensor lens assembly 100 can be provided by omitting at least one of the at least one passive electronic component 3, the shielding layer 8, and the sealing compound 9a.

The circuit board 1 in the present embodiment can be a printed circuit board (PCB) or a flexible printed circuit (FPC), but the present disclosure is not limited thereto. The circuit board 1 has a first surface 11 and a second surface 12 that is opposite to the first surface 11. The circuit board 1 has no slot recessed in the first surface 11, and the circuit board 1 includes a chip-bonding region 13 arranged on the first surface 11 and a plurality of bonding pads 14 that are arranged on the first surface 11 and outside of the chip-bonding region 13.

In addition, as shown in FIG. 1 and FIG. 2, the circuit board 1 can be provided with an electrical connector 15. The circuit board 1 is configured to be detachably connected to an electronic device (not shown in the drawings) through the electrical connector 15, so that the sensor lens assembly 100 can be assembled and electrically connected to the electronic device.

Figure 5:
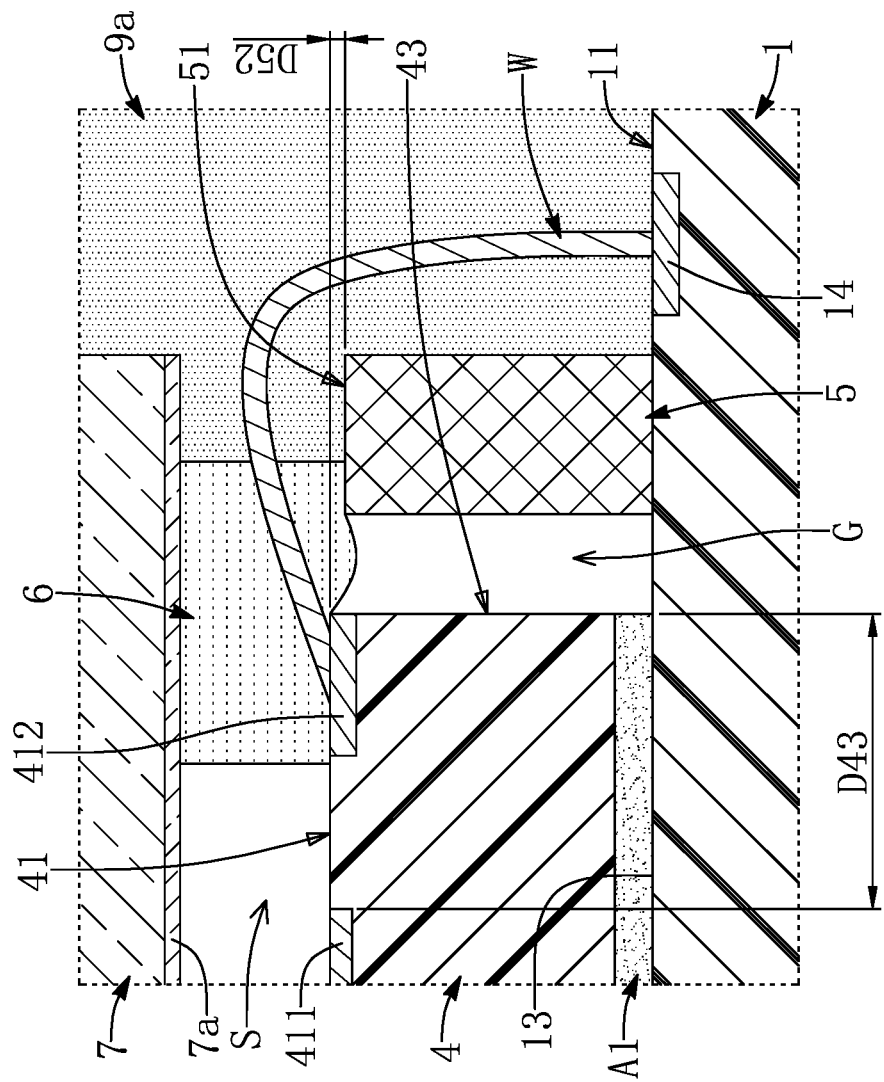
FIG. 5 is an enlarged view of portion V of FIG. 4.

As shown in FIG. 3 to FIG. 5, the optical module 2 includes a frame 21, at least one lens 22 assembled into the frame 21, and a filtering sheet 23 assembled into the frame 21. A bottom of the frame 21 is fixed to the first surface 11 of the circuit board 1, a central axis L of the at least one lens 22 passes through the chip-bonding region 13, and the filtering sheet 23 is positioned along the central axis L. The at least one passive electronic component 3 is assembled to the first surface 11 of the circuit board 1 and is arranged adjacent to the frame 21. Moreover, a quantity of the at least one passive electronic component 3 can be adjusted or changed according to design requirements, and outer lateral edges of the circuit board 1 can be partially flush with the frame 21 (e.g., three of the outer lateral edges of the circuit board 1 are flush with the frame 21), but the present disclosure is not limited thereto.

Specifically, a quantity of the at least one lens 22 in the present embodiment is more than one, and the central axes L of the multiple ones of the lens 22 are overlapped with each other, and the filtering sheet 23 is located between the lenses 22 and the chip-bonding region 13. The frame 21, the filtering sheet 23, and the first surface 11 of the circuit board 1 jointly define a distribution space 24. Moreover, the chip-bonding region 13, the bonding pads 14, the at least one passive electronic component 3, the sensor chip 4, the extending wall 5, the wires W, the supporting adhesive layer 6, the light-permeable sheet 7, the shielding layer 8, and the sealing compound 9a are arranged in the distribution space 24.

The sensor chip 4 in the present embodiment is an image sensor chip, but the present disclosure is not limited thereto. The sensor chip 4 is disposed on the chip-bonding region 13 of the circuit board 1 (e.g., a bottom surface 42 of the sensor chip 4 faces the chip-bonding region 13), and is located at the central axis L.

It should be noted that the sensor lens assembly 100 in the present embodiment includes a chip-bonding adhesive A1, and the sensor chip 4 is fixed to the chip-bonding region 13 through the chip-bonding adhesive A1 (e.g., the bottom surface 42 of the sensor chip 4 is adhered to the chip-bonding region 13 through the chip-bonding adhesive A1), but the present disclosure is not limited thereto. For example, in other embodiments of the present disclosure not shown in the drawings, the chip-bonding adhesive A1 can be omitted or can be replaced by other components.

Moreover, the sensor chip 4 includes a sensing region 411 arranged on the top surface 41 and a plurality of connection pads 412 that are arranged on the top surface 41 and outside of the sensing region 411. The sensing region 411 in the present embodiment is spaced apart from an outer lateral surface 43 of the sensor chip 4 by a distance D43 that is less than 300 μm. The filtering sheet 23 is chosen according to (or corresponding to) the sensing region 411 of the sensor chip 4. For example, when light passes through the at least one lens 22, the filtering sheet 23 is configured to (only) allow the light of a wavelength band corresponding to the sensing region 411 to pass therethrough.

In the present embodiment, the bonding pads 14 are in a ring-shaped arrangement, the connection pads 412 arranged on the top surface 41 surround the sensing region 411 in a substantially ring-shaped arrangement, and the connection pads 412 preferably correspond in position to the bonding pads 14, respectively, but the present disclosure is not limited thereto. For example, in other embodiments of the present disclosure not shown in the drawings, the connection pads 412 can be arranged in two rows that are respectively located at two opposite sides of the sensing region 411, the bonding pads 14 can also be arranged in two rows that are respectively located at two opposite sides of the chip-bonding region 13, and the connection pads 412 respectively correspond in position to the bonding pads 14.

The wires 5 electrically couple the bonding pads 14 to the connection pads 412, respectively. In other words, each of the wires 5 is formed in a wiring manner, so that two opposite ends of each of the wires 5 are respectively connected to one of the bonding pads 14 and the corresponding connection pad 412.

The extending wall 5 is disposed on the first surface 11 and surrounds the sensor chip 4, and the extending wall 5 and the outer lateral surface 43 of the sensor chip 4 have a gap G therebetween. The gap G is filled with air, and a width of the gap G in the present embodiment is within a range from 50 μm to 100 μm, but the present disclosure is not limited thereto.

Specifically, the extending wall 5 in the present embodiment is in a ringed shape and can be a solder mask layer, a photoresist layer, or an epoxy resin layer. In addition, the material of the extending wall 5 can be colloid, polymide, butylcyclobutene (BCB), parylene, polynaphthalenes, fluorocarbons, acrylates, photoresist, ceramic, inorganic material (e.g., silicon oxide, silicon nitride, silicon oxynitride, metal oxide or a combination of the foregoing), or other suitable insulative materials.

Moreover, the extending wall 5 has an extending top surface 51, and a step difference D52 between the extending top surface 51 and the top surface 41 of the sensor chip 4 is less than or equal to 50 μm. However, in other embodiments of the present disclosure not shown in the drawings, the extending top surface 51 can be substantially flush with the top surface 41 of the sensor chip 4 (i.e., the step difference D52 is substantially zero).

The supporting adhesive layer 6 is in a ringed shape and is disposed on the extending top surface 51 of the extending wall 5 and the top surface 41 of the sensor chip 4. The supporting adhesive layer 6 surrounds or is arranged outside of the sensing region 411, the supporting adhesive layer 6 is arranged across the gap G, and a part of the supporting adhesive layer 6 is arranged in the gap G. Moreover, each of the connection pads 412 and a part of the corresponding wire W connected thereto are embedded in the supporting adhesive layer 6, but the present disclosure is not limited thereto.

The light-permeable sheet 7 has two opposite surfaces respectively coated with two anti-reflective films 7a thereon that respectively define an inner surface 71 and an outer surface 72. The inner surface 71 of the light-permeable sheet 7 is disposed on the supporting adhesive layer 6, so that the light-permeable sheet 7, the supporting adhesive layer 6, and the top surface 41 of the sensor chip 4 jointly define an enclosed space S. The sensing region 411 is arranged in the enclosed space S and faces the light-permeable sheet 7.

The shielding layer 8 is formed on the outer surface 72 of the light-permeable sheet 7, and the shielding layer 8 is in a ringed shape and has an opening 81 arranged above the sensing region 411. The distribution manner of the shielding layer 8 formed on the outer surface 72 can be adjusted or changed according to design requirements. Accordingly, a flare phenomenon of the sensor chip 4, which is caused from an external light passing through the light-permeable sheet 7, can be effectively avoided by the shielding layer 8.

The sealing compound 9a is formed on the first surface 11 of the circuit board 1. The sealing compound 9a surrounds the extending wall 5, the supporting adhesive layer 6, and the light-permeable sheet 7. The sealing compound 9a in the present embodiment is an opaque liquid compound, and at least part of the passive electronic component 3, the connection pads 14, and at least part of each of the wires W are embedded in the sealing compound 9a, but the present disclosure is not limited thereto. For example, the sealing compound 9a can be light-permeable.

In summary, through cooperation of the above components, the sensor lens assembly 100 in the present embodiment does not need to go through any soldering process through non-soldering the configuration thereof, such as to allow that the component relationships arranged in the distribution space 24 (e.g., connection between any two of the sensor chip 4, the extending wall 5, the wires W, the supporting adhesive layer 6, the light-permeable sheet 7, and the sealing compound 9a) just need to satisfy a lower level of high-temperature resistance requirement. Accordingly, material cost of the sensor lens assembly 100 can be decreased, and the product yield of the sensor lens assembly 100 can be increased.

Specifically, since the sensor lens assembly 100 of the present embodiment does not need to go through a soldering process, the sensor lens assembly 100 does not need to be subjected to relevant testing processes, thereby effectively simplifying the entire production process to improve the production efficiency of the sensor lens assembly 100.

Moreover, the sensor lens assembly 100 in the present embodiment is provided with the extending wall 5 that is in cooperation with the sensor chip 4 and the supporting adhesive layer 6, so that the sensor chip 4 having a small size (e.g., the distance D43 is less than 300 μm) can be assembled in the sensor lens assembly 100, thereby satisfying the industry trend of miniaturization of the sensor chip 4.

Second Embodiment

Figure 6:
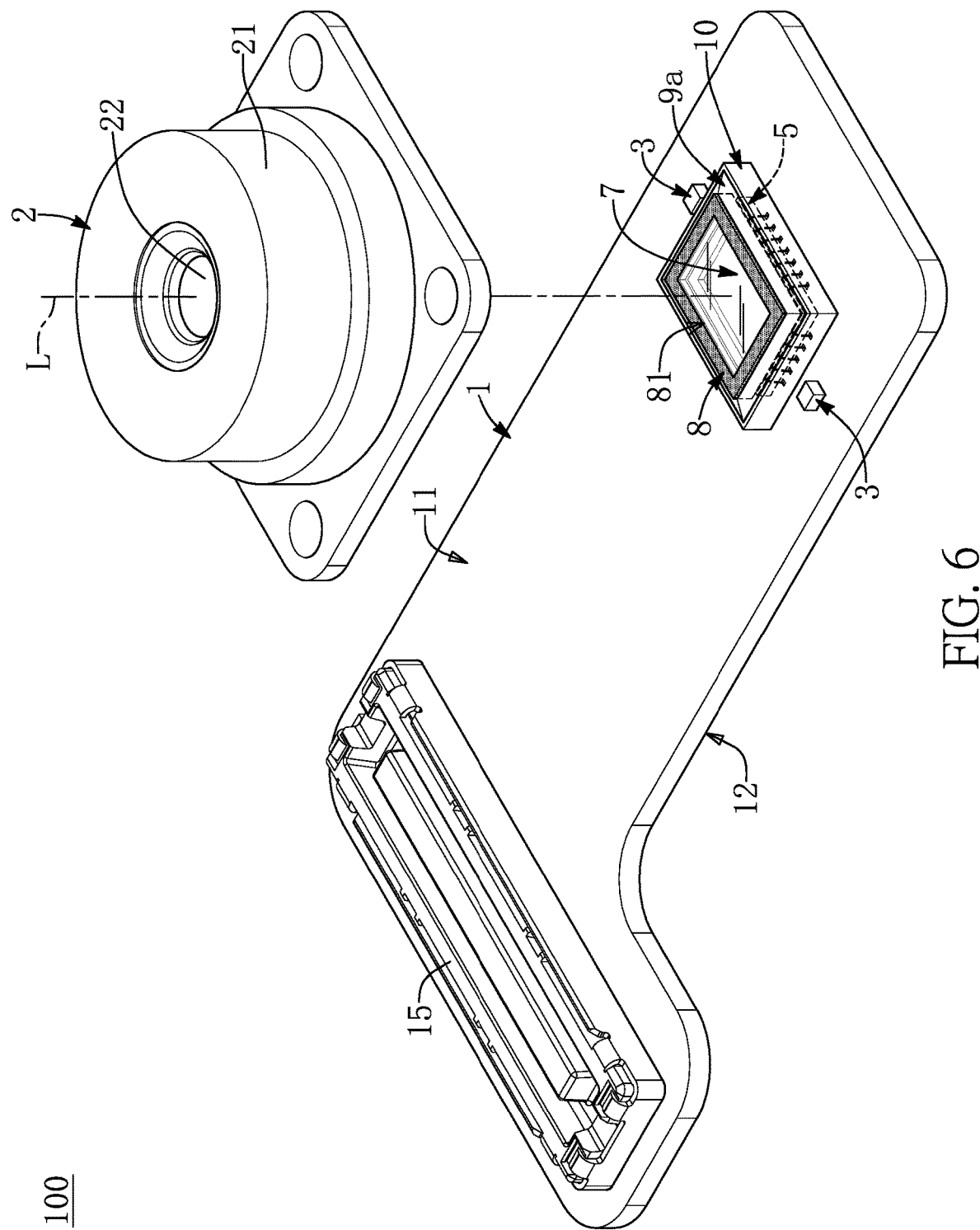
FIG. 6 is an exploded view of the sensor lens assembly according to a second embodiment of the present disclosure.
Figure 7:
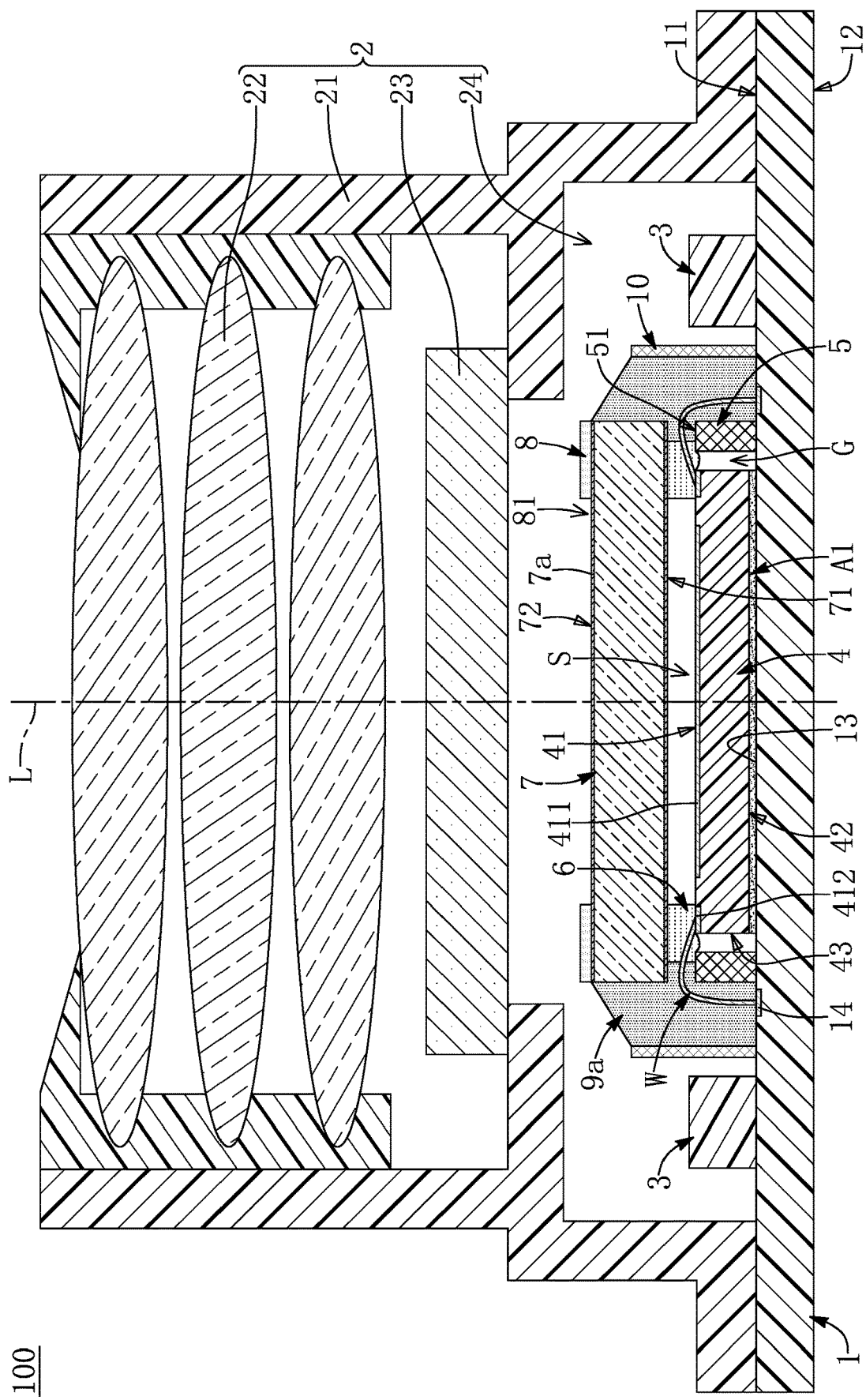
FIG. 7 is a cross-sectional view of the sensor lens assembly according to the second embodiment of the present disclosure.

Referring to FIG. 6 and FIG. 7, a second embodiment of the present disclosure is provided, which is similar to the first embodiment of the present disclosure. For the sake of brevity, descriptions of the same components in the first and second embodiments of the present disclosure will be omitted herein, and the following description discloses the different features between the first and second embodiments.

In the present embodiment, the extending top surface 51 is substantially flush with the top surface 41 of the sensor chip 4. Moreover, the sensor lens assembly 100 includes a ring-shaped wall 10 arranged in the distribution space 24. The ring-shaped wall 10 is disposed on the first surface 11 and surrounds the wires W, and the sealing compound 9a is arranged inside of the ring-shaped wall 10. In other words, the ring-shaped wall 10 forms a flowing boundary for the sealing compound 9a, and a top end of the ring-shaped wall 10 relative to the first surface 11 is higher than the inner surface 71 of the light-permeable sheet 7 and is lower than the outer surface 72 of the light-permeable sheet 7.

Accordingly, the sensor lens assembly 100 in the present embodiment can be provided to effectively control the distribution of the sealing compound 9a by using the ring-shaped wall 10, so that the sealing compound 9a can have a better sealing effect and can avoid affecting other components (e.g., the passive electronic component 3).

Third Embodiment

Figure 8:
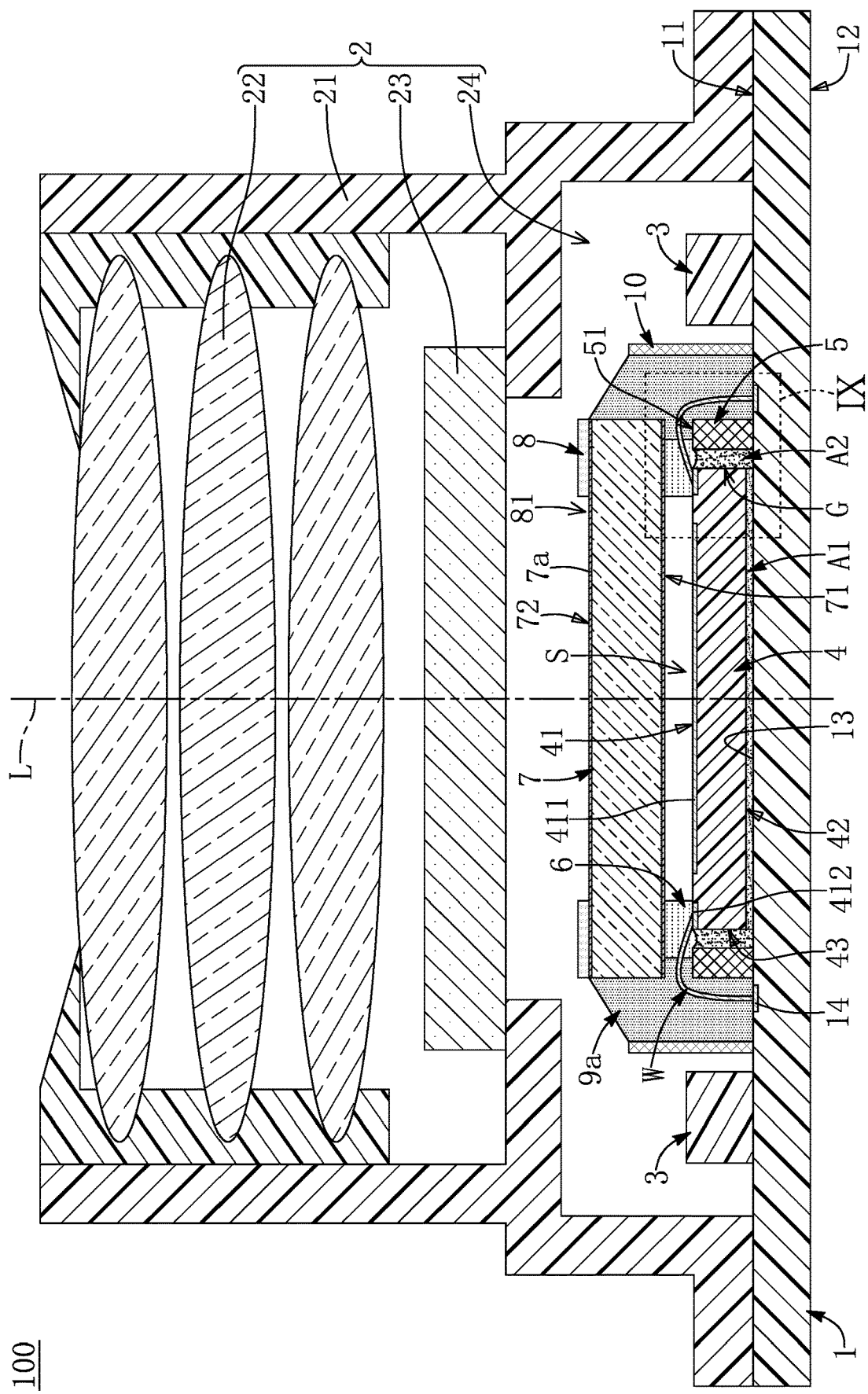
FIG. 8 is a cross-sectional view of the sensor lens assembly according to a third embodiment of the present disclosure.
Figure 9:
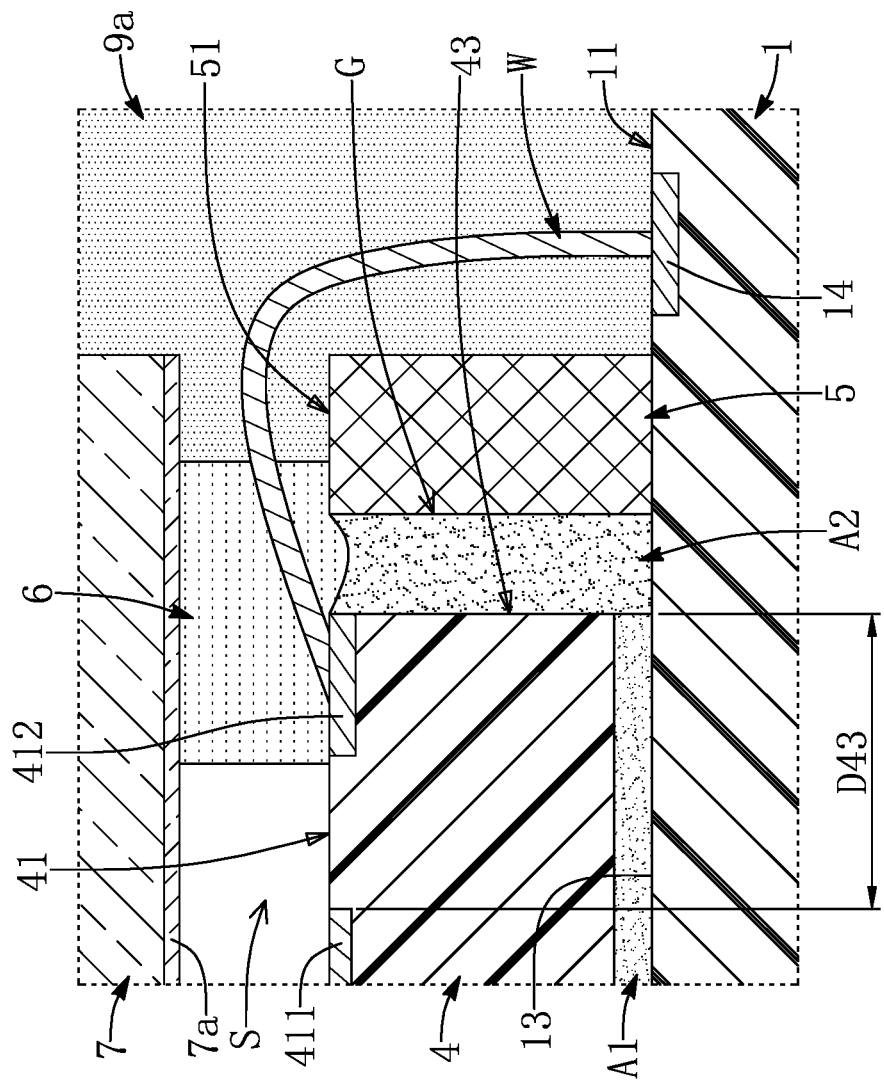
FIG. 9 is an enlarged view of portion IX of FIG. 8.
Figure 10:
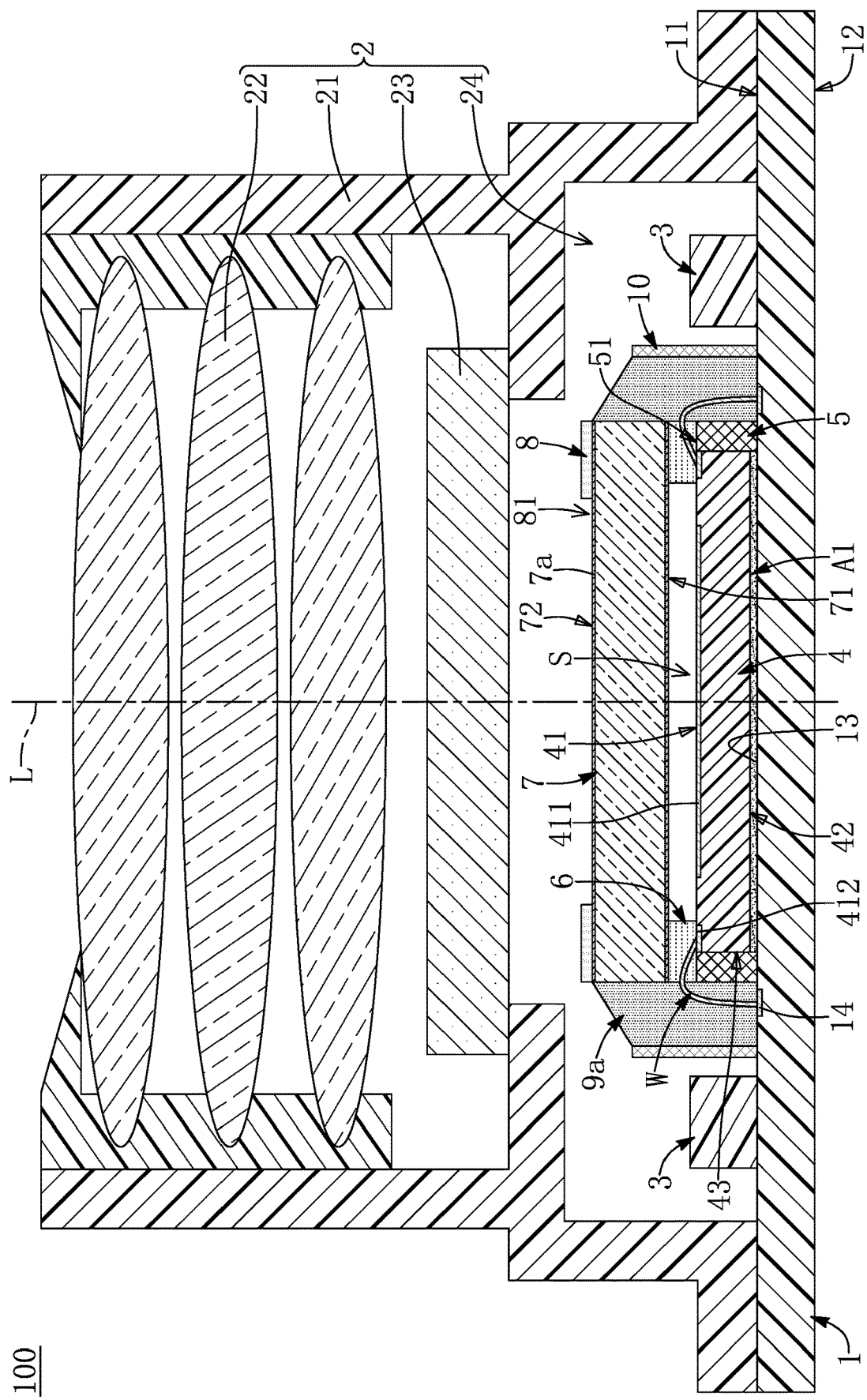
FIG. 10 is a cross-sectional view of the sensor lens assembly in another configuration according to the third embodiment of the present disclosure.

Referring to FIG. 8 to FIG. 10, a third embodiment of the present disclosure is provided, which is similar to the second embodiment of the present disclosure. For the sake of brevity, descriptions of the same components in the second and third embodiments of the present disclosure will be omitted herein, and the following description discloses the different features between the second and third embodiments.

As shown in FIG. 8 and FIG. 9 of the present embodiment, the sensor lens assembly 100 includes a filling adhesive A2. The gap G is fully filled with the filling adhesive A2, and the filling adhesive A2 is adhered to the extending wall 5, the sensor chip 4, and the part of the supporting adhesive layer 6 that is arranged in the gap G. The chip-bonding adhesive A1 and the filling adhesive A2 in the present embodiment are made of different materials, but the present disclosure is not limited thereto. For example, in other embodiments of the present disclosure, the chip-bonding adhesive A1 and the filling adhesive A2 can be made of a same material.

Accordingly, the sensor lens assembly 100 in the present embodiment can remove the air in the gap G by the filling adhesive A2, thereby effectively reducing the possibility of separation of the components adjacent to the gap G due to the thermal expansion of the air. In addition, as shown in FIG. 10, the extending wall 5 of the sensor lens assembly 100 can cover and be connected to the outer lateral surface 43 of the sensor chip 4, so that the gap G does not exist and the filling adhesive A2 can be omitted.

Fourth Embodiment

Figure 11:
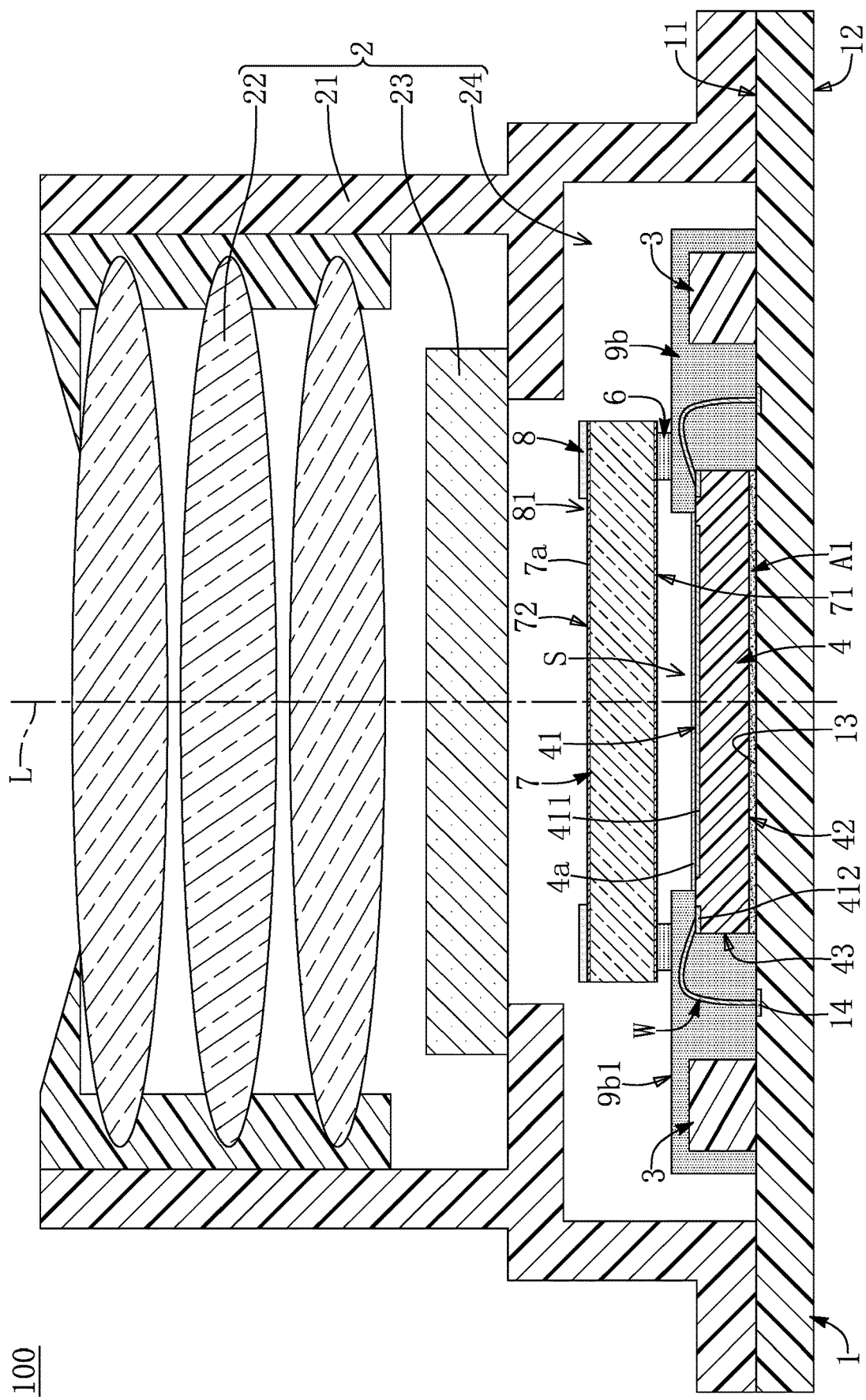
FIG. 11 is a cross-sectional view of the sensor lens assembly according to a fourth embodiment of the present disclosure.

Referring to FIG. 11, a fourth embodiment of the present disclosure is provided, which is similar to the first embodiment of the present disclosure. For the sake of brevity, descriptions of the same components in the first and fourth embodiments of the present disclosure will be omitted herein, and the following description discloses the different features between the first and fourth embodiments.

In the present embodiment, the sensor lens assembly 100 includes a circuit board 1, an optical module 2 fixed to the circuit board 1, at least one passive electronic component 3 assembled to the circuit board 1, a sensor chip 4 assembled to the circuit board 1, a plurality of wires W electrically coupling the sensor chip 4 and the circuit board 1, a transparent layer 4a having a low refractive index and formed on the sensor chip 4, a molding compound 9b formed on the first surface 11, a supporting adhesive layer 6 disposed on the molding compound 9b, a light-permeable sheet 7 disposed on the supporting adhesive layer 6, and a shielding layer 8 that is formed on the light-permeable sheet 7.

It should be noted that structure and partial connection relationship of the circuit board 1, the optical module 2, the at least one passive electronic component 3, the sensor chip 4, the wires W, the supporting adhesive layer 6, the light-permeable sheet 7, and the shielding layer 8 in the present embodiment are identical to those described in the first embodiment and will be omitted herein for the sake of brevity.

In the present embodiment, the transparent layer 4a and the molding compound 9b are arranged in the distribution space 24, the transparent layer 4a is formed on the top surface 41 of the sensor chip 4, and the sensing region 411 is embedded in the transparent layer 4a. The low refractive index of the transparent layer is preferably within a range from 0.95 to 1.05, but the present disclosure is not limited thereto.

Moreover, the molding compound 9b is formed on the first surface 11 of the circuit board 1. The bonding pads 14, the wires W, and the sensor chip 4 are embedded in the molding compound 9b, and the transparent layer 4a is exposed from an upper surface 9b1 of the molding compound 9b. The upper surface 9b1 of the molding compound 9b is a flat surface, the supporting adhesive layer 6 is in a ringed shape, and the supporting adhesive layer 6 is disposed on the upper surface 9b1 of the molding compound 9b and surrounds the transparent layer 4a. The inner surface 71 of the light-permeable sheet 7 is disposed on the supporting adhesive layer 6, so that the light-permeable sheet 7, the supporting adhesive layer 6, and the transparent layer 4a jointly define an enclosed space S.

Accordingly, the sensor chip 4 of the sensor lens assembly 100 in the present embodiment can be in cooperation with the molding compound 9b by embedding the sensing region 411 in the transparent layer 4a, so that the sensor chip 4 having a small size can be assembled in the sensor lens assembly 100, thereby satisfying the industry trend of miniaturization of the sensor chip 4.

Fifth Embodiment

Figure 12:
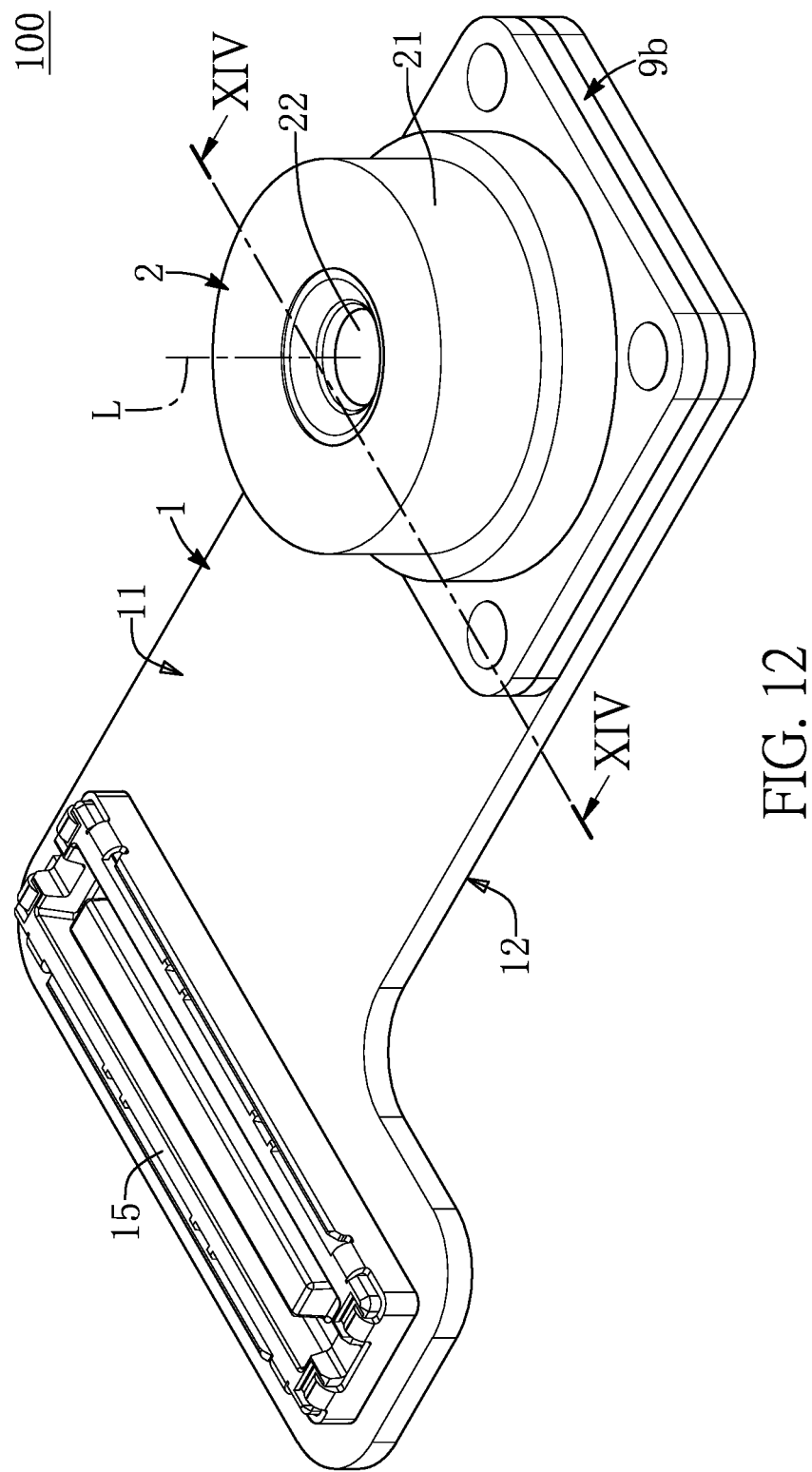
FIG. 12 is a perspective view of a sensor lens assembly according to a fifth embodiment of the present disclosure.
Figure 13:
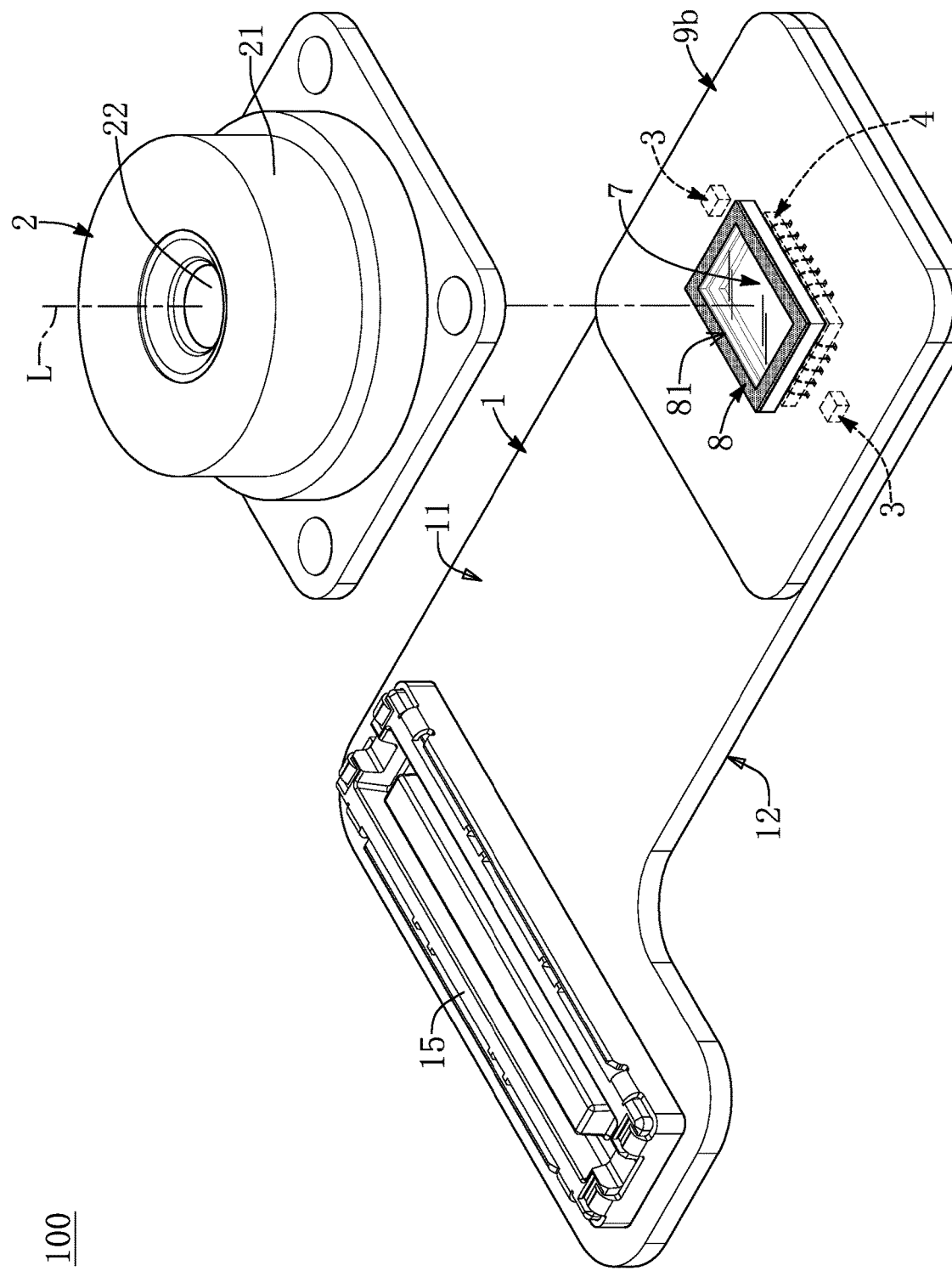
FIG. 13 is an exploded view of FIG. 12.
Figure 14:
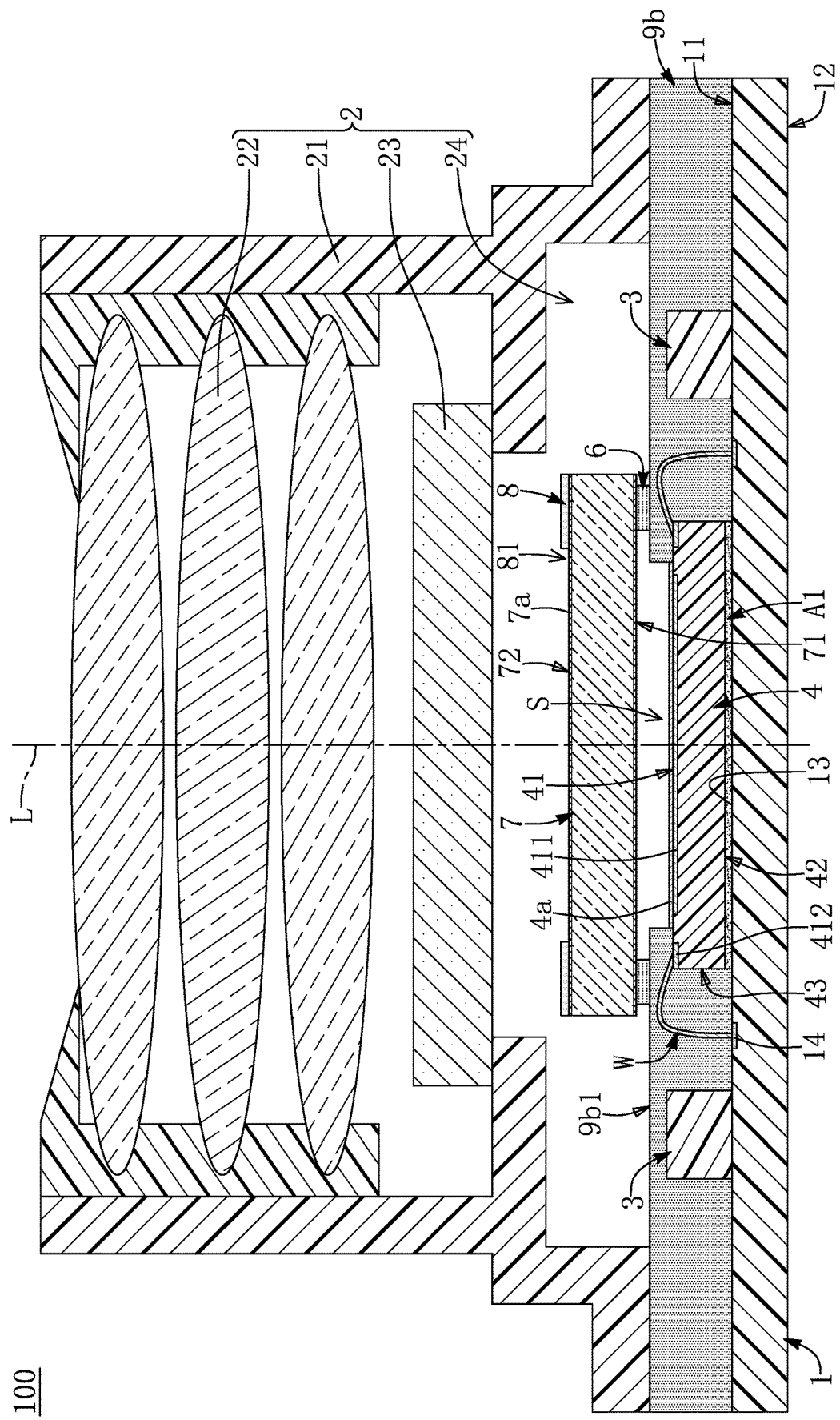
FIG. 14 is a cross-sectional view taken along line XIV-XIV of FIG. 12.

Referring to FIG. 12 to FIG. 14, a fifth embodiment of the present disclosure is provided, which is similar to the fourth embodiment of the present disclosure. For the sake of brevity, descriptions of the same components in the fourth and fifth embodiments of the present disclosure will be omitted herein, and the following description discloses the different features between the fourth and fifth embodiments.

In the present embodiment, the molding compound 9b is arranged outside of the distribution space 24, and the at least one passive electronic component 3 is embedded in the molding compound 9b. The frame 21 is fixed to (e.g., adhered to or screwed to) the upper surface 9b1 of the molding compound 9b. In other words, a part of the sensor lens assembly 100 in the present embodiment arranged in the distribution space 24 only includes the supporting adhesive layer 6 and the light-permeable sheet 7. Accordingly, the sensor lens assembly 100 of the present embodiment provides a new configuration other than the existing configuration, and the new configuration is suitable for being developed to different application requirements and for being an automated production process.

Beneficial Effects of the Embodiments

In conclusion, through cooperation of the above components, the sensor lens assembly provided by the present disclosure does not need to go through any soldering process through the non-soldering configuration thereof, such as to allow that the component relationships arranged in the distribution space (e.g., connection between any two of the sensor chip, the extending wall, the wires, the supporting adhesive layer, the light-permeable sheet, and the sealing compound) just need to satisfy a lower level of high-temperature resistance requirement. Accordingly, material cost of the sensor lens assembly can be decreased, and the product yield of the sensor lens assembly can be increased. Specifically, since the sensor lens assembly of the present disclosure does not need to go through a soldering process, the sensor lens assembly does not need to be subjected to relevant testing processes, thereby effectively simplifying the entire production process to improve the production efficiency of the sensor lens assembly.

Moreover, the sensor lens assembly of the present disclosure is provided with the extending wall that is in cooperation with the sensor chip and the supporting adhesive layer (or the sensor chip of the sensor lens assembly can be in cooperation with the molding compound by embedding the sensing region in the transparent layer), so that the sensor chip having a small size can be assembled in the sensor lens assembly, thereby satisfying the industry trend of miniaturization of the sensor chip.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A sensor lens assembly having a non-soldering configuration, comprising:
   a circuit board having a first surface and a second surface that is opposite to the first surface, wherein the first surface of the circuit board includes a chip-bonding region and a plurality of bonding pads that are arranged outside of the chip-bonding region;
   an optical module including:
      a frame fixed on the first surface of the circuit board;
      at least one lens assembled into the frame, wherein a central axis of the at least one lens passes through the chip-bonding region; and
      a filtering sheet assembled into the frame and positioned along the central axis, wherein the frame and the filtering sheet jointly define a distribution space, and the chip-bonding region and the bonding pads are arranged in the distribution space;
   a sensor chip including a sensing region arranged on a top surface thereof and a plurality of connection pads that are arranged on the top surface and outside of the sensing region, wherein the sensor chip is disposed on the chip-bonding region, and the sensing region is located at the central axis;
   an extending wall disposed on the first surface and surrounding the sensor chip, wherein the extending wall has an extending top surface, and a step difference between the extending top surface and the top surface of the sensor chip is less than or equal to 50 μm;
   a plurality of wires, wherein the bonding pads are respectively and electrically coupled to the connection pads through the wires;
   a supporting adhesive layer being in a ringed shape, wherein the supporting adhesive layer is disposed on the extending top surface of the extending wall and the top surface of the sensor chip, and the supporting adhesive layer is arranged outside of the sensing region; and a light-permeable sheet having two opposite surfaces that are respectively coated with two anti-reflective films thereon and that are respectively defined as an inner surface and an outer surface, wherein the inner surface of the light-permeable sheet is disposed on the supporting adhesive layer, so that the light-permeable sheet, the supporting adhesive layer, and the top surface of the sensor chip jointly define an enclosed space, and wherein the sensing region is arranged in the enclosed space.

2. The sensor lens assembly according to claim 1, wherein the extending wall and the sensor chip have a gap therebetween, and the supporting adhesive layer is arranged across the gap, with a part of the supporting adhesive layer being arranged in the gap.

3. The sensor lens assembly according to claim 2, further comprising a chip-bonding adhesive, wherein the sensor chip is fixed to the chip-bonding region through the chip-bonding adhesive, and the gap is filled with air.

4. The sensor lens assembly according to claim 2, further comprising a chip-bonding adhesive and a filling adhesive, wherein the sensor chip is fixed to the chip-bonding region through the chip-bonding adhesive, and the gap is fully filled with the filling adhesive, and wherein the filling adhesive is adhered to the extending wall, the sensor chip, and the part of the supporting adhesive layer that is arranged in the gap.

5. The sensor lens assembly according to claim 4, wherein the chip-bonding adhesive and the filling adhesive are made of different materials.

6. The sensor lens assembly according to claim 2, wherein the extending wall is limited to being a solder mask layer, a photoresist layer, or an epoxy resin layer, and the sensing region is spaced apart from an outer lateral surface of the sensor chip by a distance that is less than 300 μm.

7. The sensor lens assembly according to claim 1, wherein the extending wall covers and is connected to an outer lateral surface of the sensor chip.

8. The sensor lens assembly according to claim 1, further comprising a sealing compound formed on the first surface, wherein the sealing compound surrounds the extending wall, the supporting adhesive layer, and the light-permeable sheet, and a part of each of the wires is embedded in the sealing compound.

9. The sensor lens assembly according to claim 8, further comprising a ring-shaped wall arranged in the distribution space, wherein the ring-shaped wall is disposed on the first surface and surrounds the wires, and the sealing compound is arranged inside of the ring-shaped wall, and wherein a top end of the ring-shaped wall relative to the first surface is higher than the inner surface of the light-permeable sheet and is lower than the outer surface of the light-permeable sheet.

10. The sensor lens assembly according to claim 8, further comprising at least one passive electronic component arranged in the distribution space, wherein the sealing compound is opaque, and the at least one passive electronic component is mounted on the first surface of the circuit board and is at least partially embedded in the sealing compound.

11. The sensor lens assembly according to claim 1, further comprising a shielding layer formed on the outer surface of the light-permeable sheet, wherein the shielding layer is in a ringed shape and has an opening arranged above the sensing region.

12. A sensor lens assembly having a non-soldering configuration, comprising:

a circuit board having a first surface and a second surface that is opposite to the first surface, wherein the first surface of the circuit board includes a chip-bonding region and a plurality of bonding pads that are arranged outside of the chip-bonding region;

a sensor chip including a sensing region arranged on a top surface thereof and a plurality of connection pads that are arranged on the top surface and outside of the sensing region, wherein the sensor chip is disposed on the chip-bonding region;

a transparent layer having a low refractive index and formed on the top surface of the sensor chip, wherein the sensing region is embedded in the transparent layer;

a plurality of wires, wherein the bonding pads are respectively and electrically coupled to the connection pads through the wires;

a molding compound formed on the first surface, wherein the wires and the sensor chip are embedded in the molding compound, and the transparent layer is exposed from an upper surface of the molding compound;

a supporting adhesive layer being in a ringed shape, wherein the supporting adhesive layer is disposed on the upper surface of the molding compound and surrounds the transparent layer;

a light-permeable sheet having two opposite surfaces respectively coated with two anti-reflective films thereon that respectively define an inner surface and an outer surface, wherein the inner surface of the light-permeable sheet is disposed on the supporting adhesive layer, so that the light-permeable sheet, the supporting adhesive layer, and the transparent layer jointly define an enclosed space; and an optical module corresponding in position to the sensing region.

13. The sensor lens assembly according to claim 12, wherein the optical module includes:

a frame fixed on the upper surface of the molding compound;

at least one lens assembled into the frame, wherein a central axis of the at least one lens passes through the chip-bonding region; and a filtering sheet assembled into the frame and located at the central axis, wherein the supporting adhesive layer and the light-permeable sheet are arranged in a distribution space defined by the frame and the filtering sheet.

14. The sensor lens assembly according to claim 12, wherein the optical module includes:

a frame fixed on the first surface of the circuit board;

at least one lens assembled into the frame, wherein a central axis of the at least one lens passes through the chip-bonding region; and a filtering sheet assembled into the frame and positioned along the central axis, wherein the frame and the filtering sheet jointly define a distribution space, and the molding compound, the supporting adhesive layer, and the light-permeable layer are arranged in the distribution space.

15. The sensor lens assembly according to claim 12, wherein the low refractive index of the transparent layer is within a range from 0.95 to 1.05.

16. The sensor lens assembly according to claim 12, further comprising a shielding layer formed on the outer surface of the light-permeable sheet, wherein the shielding layer is in a ringed shape and has an opening arranged above the sensing region.

* * * * *